United States Patent
Fu

(10) Patent No.: US 10,310,011 B2
(45) Date of Patent: Jun. 4, 2019

(54) TURRET HANDLER FOR TESTING ELECTRONIC ELEMENTS WITH LEADS

(71) Applicant: Winbond Electronics Corp., Taichung (TW)

(72) Inventor: Ting Ming Fu, Hsinchu County (TW)

(73) Assignee: WINBOND ELECTRONICS CORP., Taichung (TW)

( * ) Notice: Subject to any disclaimer, the term of this patent is extended or adjusted under 35 U.S.C. 154(b) by 66 days.

(21) Appl. No.: 15/666,196

(22) Filed: Aug. 1, 2017

(65) Prior Publication Data
US 2018/0231606 A1 Aug. 16, 2018

(30) Foreign Application Priority Data

Feb. 13, 2017 (CN) .......................... 2017 1 0076189

(51) Int. Cl.
*G01R 31/28* (2006.01)
(52) U.S. Cl.
CPC ..... *G01R 31/2893* (2013.01); *G01R 31/2887* (2013.01)
(58) Field of Classification Search
CPC ............ G01R 1/06738; G01R 1/06744; G01R 1/07378; G01R 31/2886; G01R 3/00; G01R 31/2893; G01R 1/0433; G01R 1/0458; G01R 1/0466; G01R 31/2874; G01R 31/2887; G01R 31/2896; G01N 15/0806; G01N 15/0826; G01N 15/08; G01N 33/34; G01N 33/346; G01N 33/362; G01N 33/367
See application file for complete search history.

(56) References Cited

U.S. PATENT DOCUMENTS

| 4,993,955 | A | * | 2/1991 | Savant | ................. | H05K 7/1007 |
| | | | | | | 439/266 |
| 5,352,131 | A | | 10/1994 | Nagumo | | |
| 5,443,396 | A | * | 8/1995 | Tokushige | ........... | H05K 7/1023 |
| | | | | | | 439/266 |
| 5,562,470 | A | * | 10/1996 | Petersen | .............. | H01R 13/193 |
| | | | | | | 439/259 |
| 7,626,410 | B2 | | 12/2009 | Ohkura | | |

* cited by examiner

*Primary Examiner* — Vinh P Nguyen
(74) *Attorney, Agent, or Firm* — Muncy, Geissler, Olds & Lowe, P.C.

(57) ABSTRACT

A turret handler is provided. The turret handler is adapted to test an electronic element. The electronic element includes an element body and a plurality of leads. The turret handler includes a nozzle, a stage, a test block, and an abutting unit. The nozzle is adapted to hold the element body to move the electronic element. The test block is disposed on the stage. The nozzle moves the electronic element to the test block. The test block includes a coupling unit and an initiative portion. The coupling unit includes a coupling portion, a pressing portion, and an elastic structure. The elastic structure is connected to the pressing portion. The initiative portion is connected to the elastic structure.

8 Claims, 8 Drawing Sheets

TURRET HANDLER FOR TESTING ELECTRONIC ELEMENTS WITH LEADS

CROSS REFERENCE TO RELATED APPLICATIONS

This Application claims priority of China Patent Application No. 201710076189.6, filed on Feb. 13, 2017, the entirety of which is incorporated by reference herein.

BACKGROUND OF THE INVENTION

Field of the Invention

The present invention relates to a turret handler, and in particular to a turret handler increasing the reliability of the electronic elements.

Description of the Related Art

Turret handlers are commonly utilized to test chips without leads. When chips having leads are tested by the turret handler, stress provided by the nozzle is transmitted to the test block via the leads. If the strength of the leads is not sufficient, the leads are deformed by the stress, and the standoff value of the leads is decreased, impacting the reliability of the after-test chips. However, the turret handler provides high test efficiency with decreased volume, and testing the chips having leads by the turret handler is required.

BRIEF SUMMARY OF THE INVENTION

In one embodiment, a turret handler is provided. The turret handler is adapted to test an electronic element. The electronic element comprises an element body and a plurality of leads. The turret handler includes a nozzle, a stage, a test block and an abutting unit. The nozzle is adapted to hold the element body to move the electronic element. The test block is disposed on the stage. The nozzle moves the electronic element to the test block. The test block includes a coupling unit and an initiative portion. The coupling unit includes a coupling portion, a pressing portion, and an elastic structure. The elastic structure is connected to the pressing portion. The initiative portion is connected to the elastic structure. In an access state, the abutting unit applies a reaction force to the initiative portion, the initiative portion pushes the elastic structure, the pressing portion is in a first orientation, and the electronic element is picked or placed. In a test state, the abutting unit is separated from the test block, the reaction force upon the initiative portion is released, the initiative portion releases the elastic structure, the pressing portion is moved to a second orientation to press the leads and the coupling portion, and the electronic element is tested through the coupling portion.

In another embodiment, a test method is provided. First, the turret handler mentioned above is provided. The turret handler further comprises an element input unit (such as a tray) and an element output unit. Then, the nozzle vacuum-absorbs and raises the electronic element from the element input unit. Next, the nozzle places the electronic element on the test block. Then, the nozzle raises the electronic element from the test block, wherein the electronic element is moved and placed on the element output unit. In the access state and the test state, the nozzle continuously holds the electronic element. Particularly, between the step of the nozzle holding and raising the electronic element from the element input unit and the step of the nozzle placing the electronic element to the element output unit, the nozzle continuously vacuum-absorbs the electronic element.

Utilizing the turret handler of the embodiment of the invention, when the nozzle indirectly pushes the placement portion by directly pushing the element body, the major portion of the stress applied by the nozzle is directly transmitted to the placement portion through the bottom of the element body of the electronic element rather than through the leads. Therefore, the leads are prevented from becoming deformed by the stress applied by the nozzle, and the standoff value of the leads is maintained, and the reliability of the electronic element is increased. Additionally, in the test process, the nozzle continuously holds the electronic element, and the time for picking and placing the electronic element (creating vacuum and breaking vacuum) is reduced, and the testing efficiency is therefore increased.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
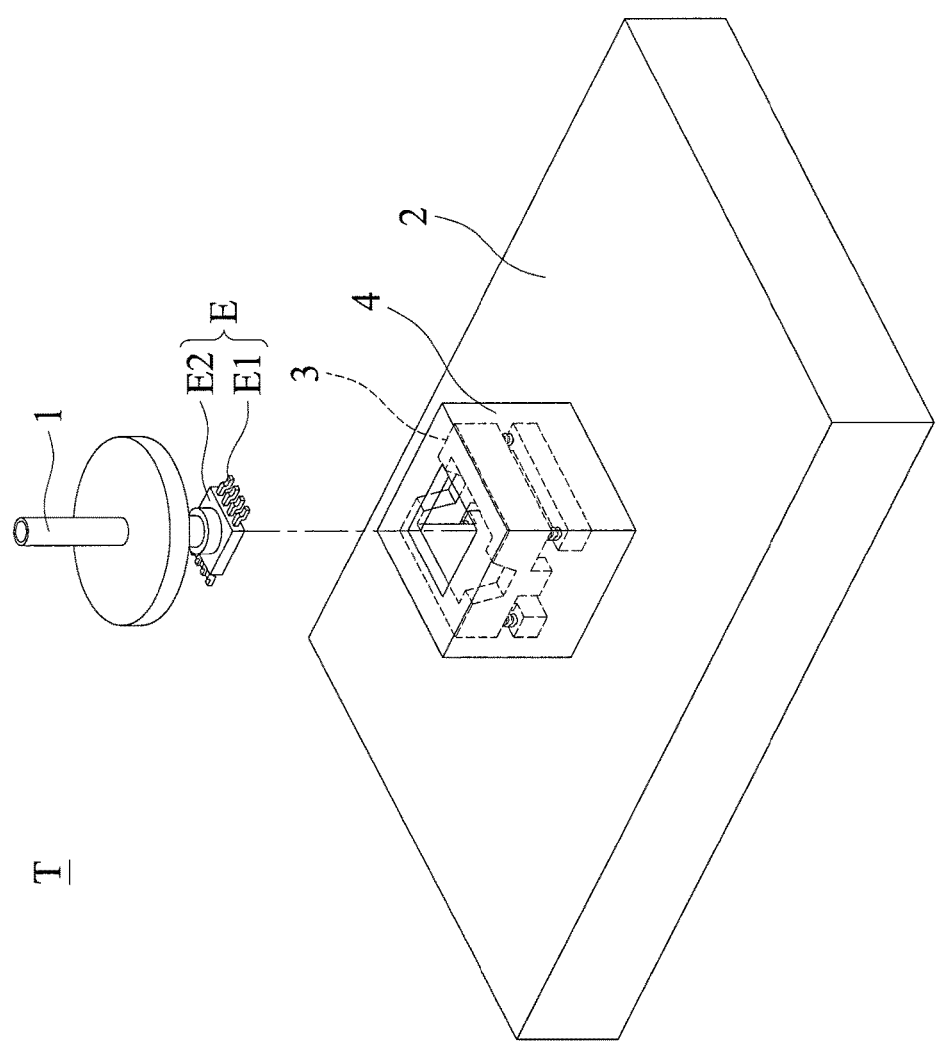
FIG. 1 shows a turret handler of an embodiment of the invention.
Figure 2:
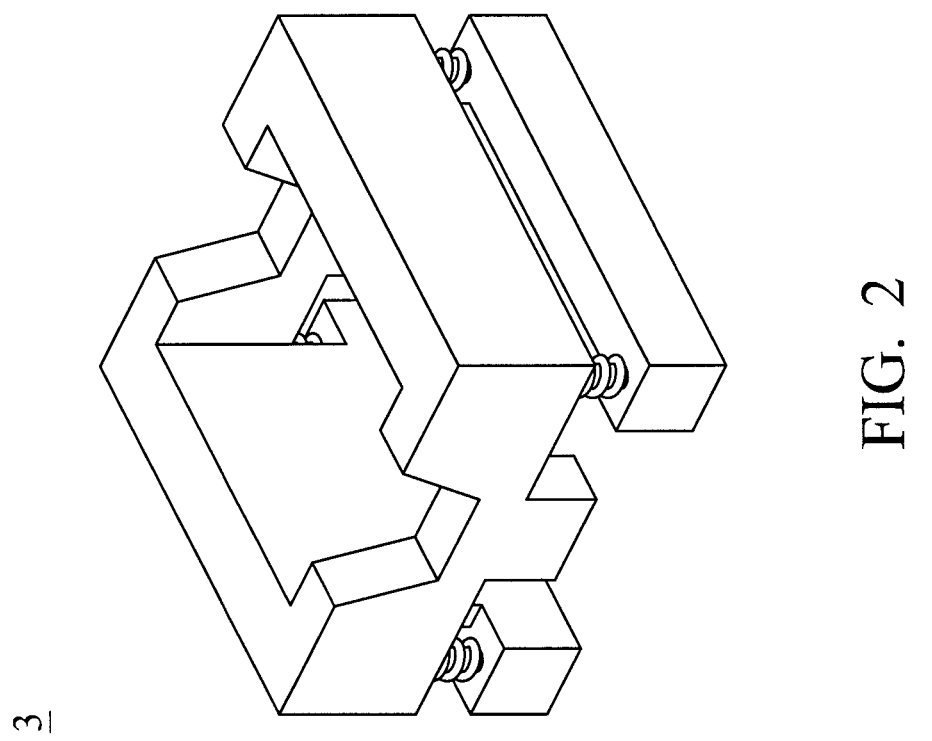
FIG. 2 shows detailed structures of a test block of the embodiment of the invention.
Figure 3A:
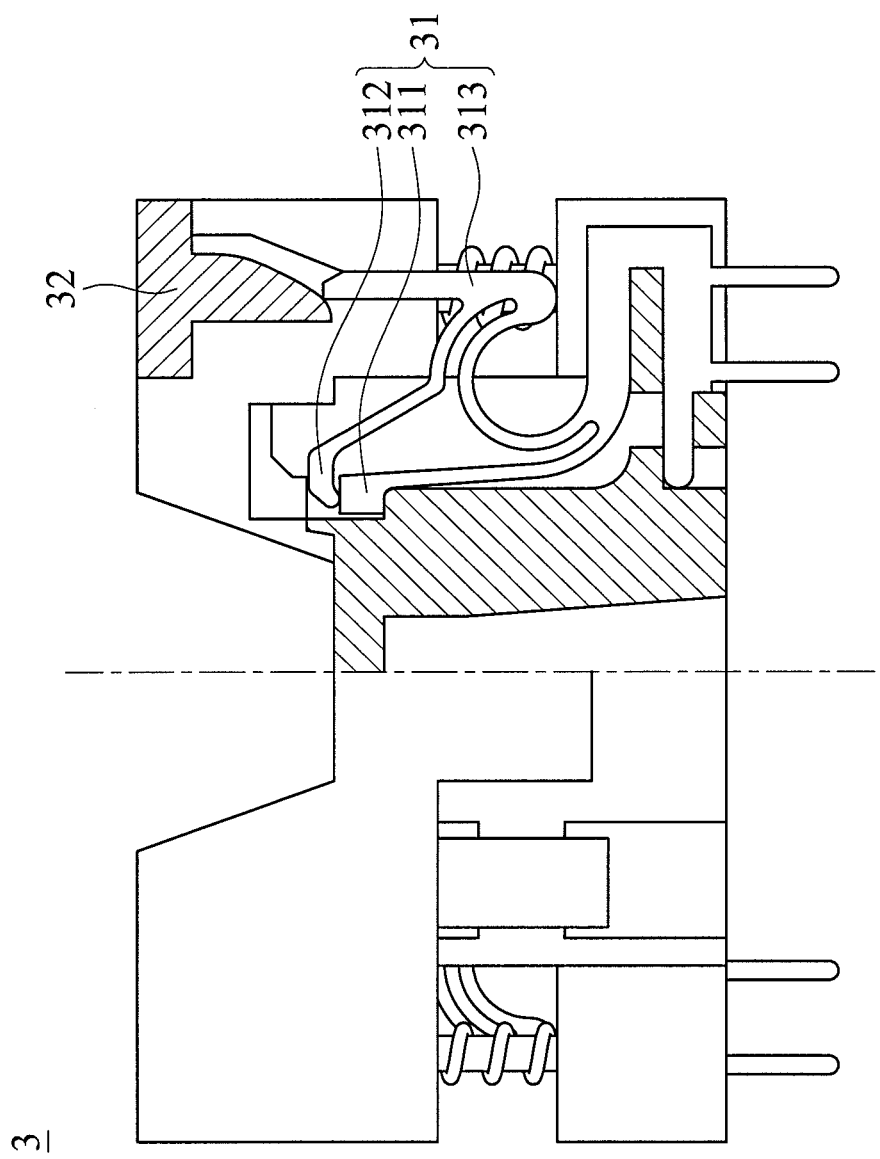
FIG. 3A is a cross-sectional view of a portion of the test block of the embodiment of the invention.

FIG. 1 shows a turret handler T of an embodiment of the invention. The turret handler T is adapted to test an electronic element E. The electronic element E comprises an element body E2 and a plurality of leads E1. The turret handler T includes a nozzle 1, a stage 2, a test block 3 and an abutting unit 4. With reference to FIGS. 1, 2 and 3A, the nozzle merely holds the element body E2 to move the electronic element E (without holding the leads E1). The test block 3 is disposed on the stage 2. The test block 3 includes a coupling unit 31 and an initiative portion 32. The coupling unit 31 includes a coupling portion 311, a pressing portion 312 and an elastic structure 313. The elastic structure 313 is connected to the pressing portion 312. The initiative portion 32 is connected to the elastic structure 31.

Figure 3B:
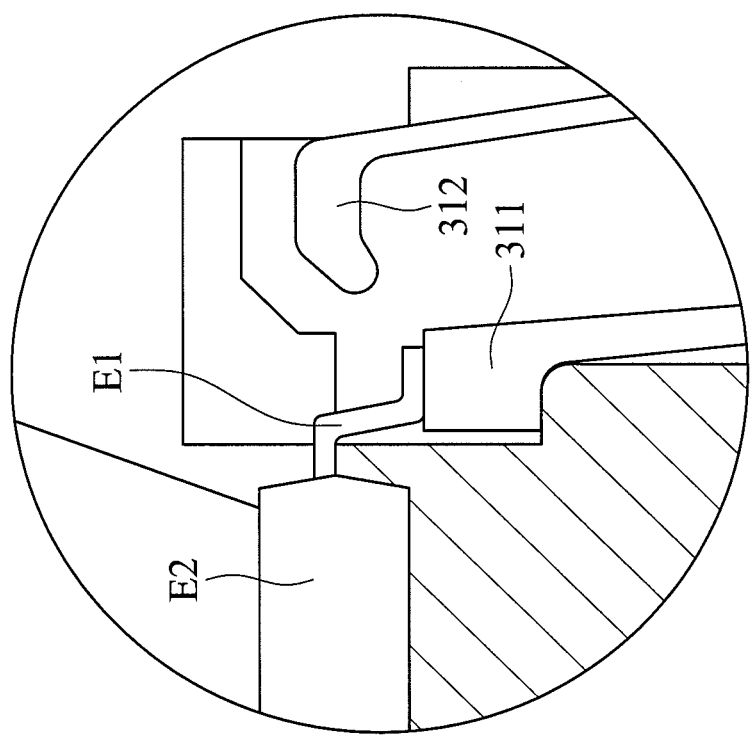
FIG. 3B shows leads being pressed and positioned by a pressing portion.

With reference to FIG. 3B, when the electronic element E is tested by the turret handler T, the leads E1 are placed on the coupling portion 311, and the pressing portion 312 presses and positions the leads E1.

Figure 4A:
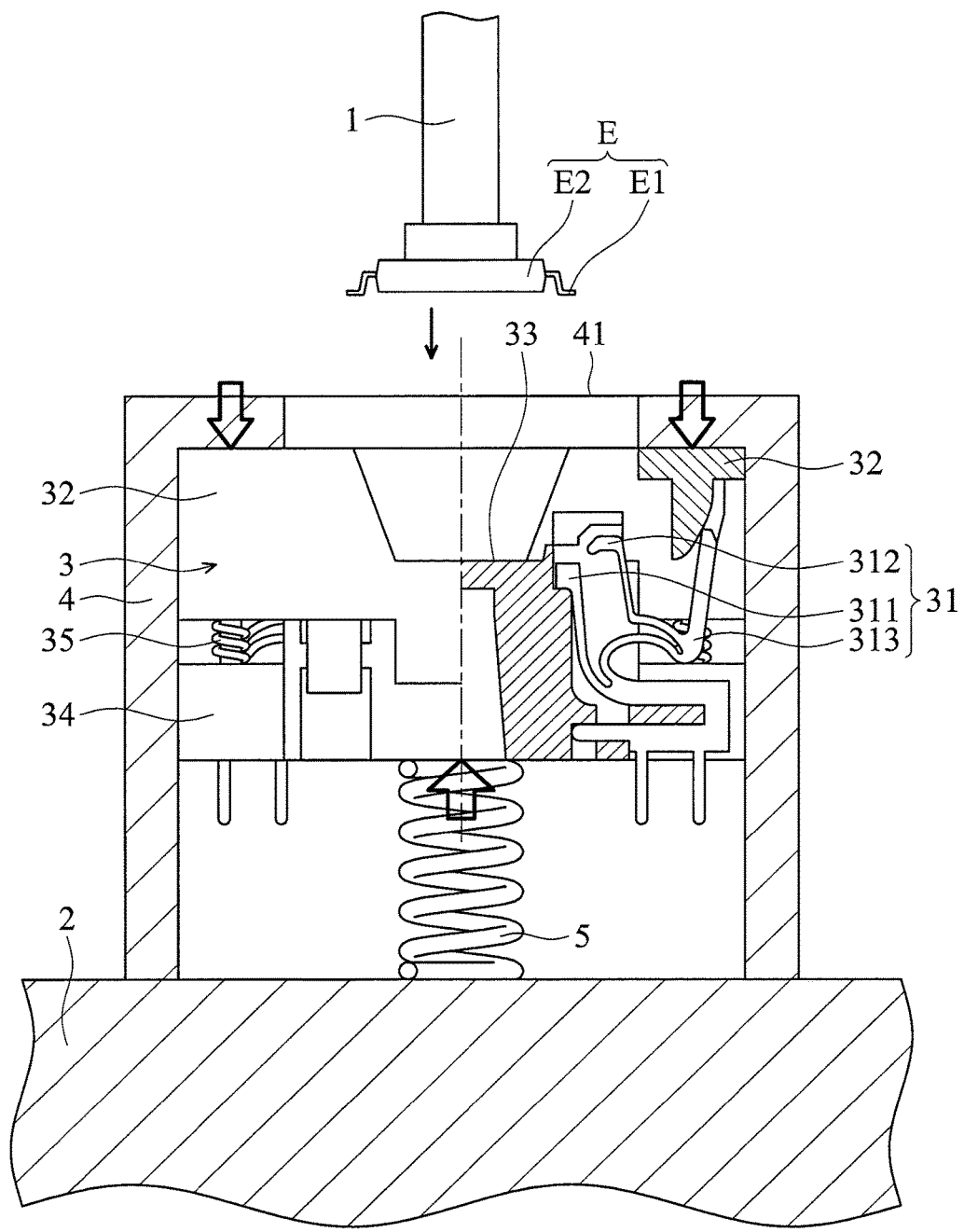
FIGS. 4A, 4B and 4C show a test process of the test block of the embodiment of the invention.
Figure 4B:
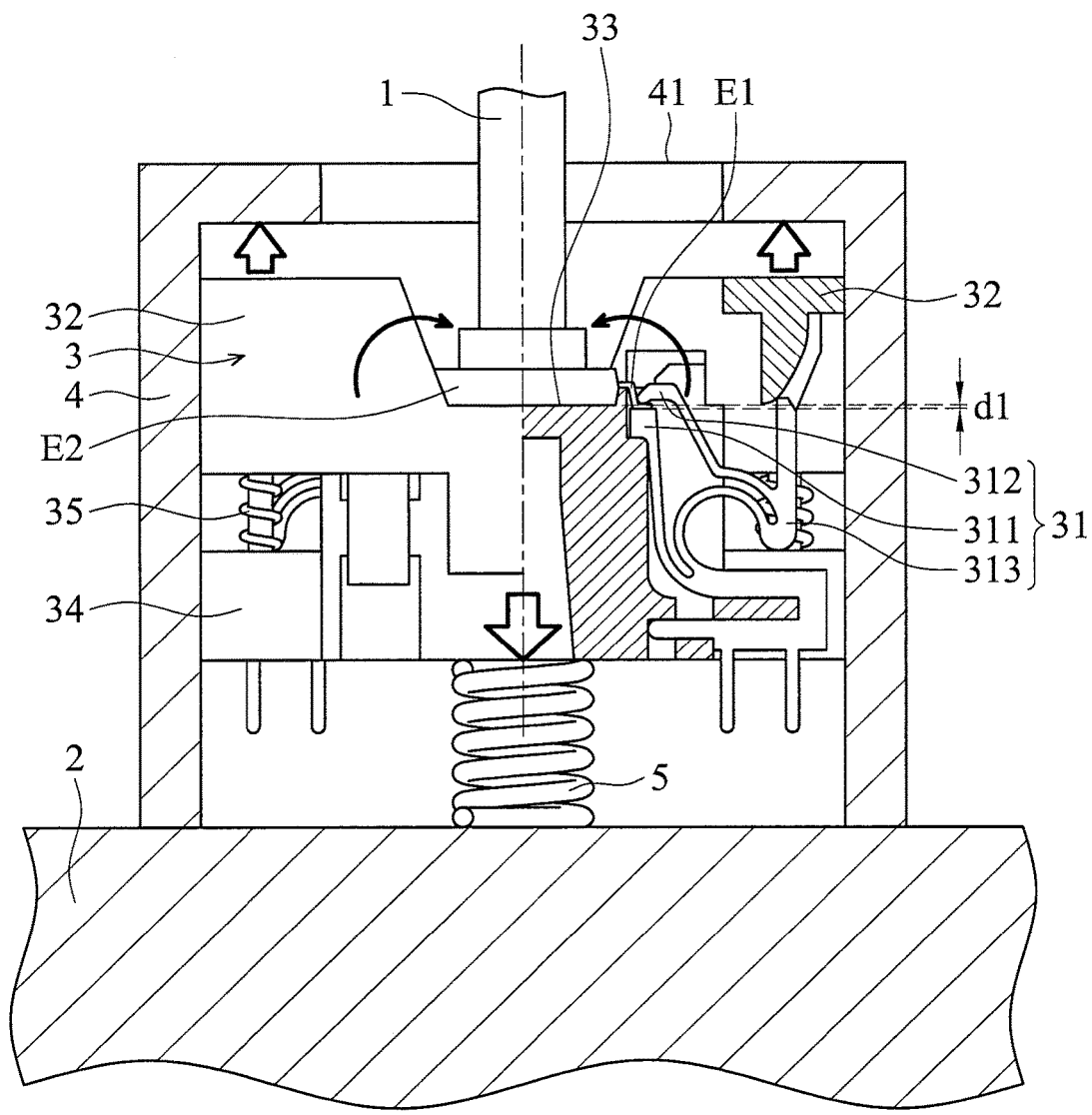
Figure 4C:
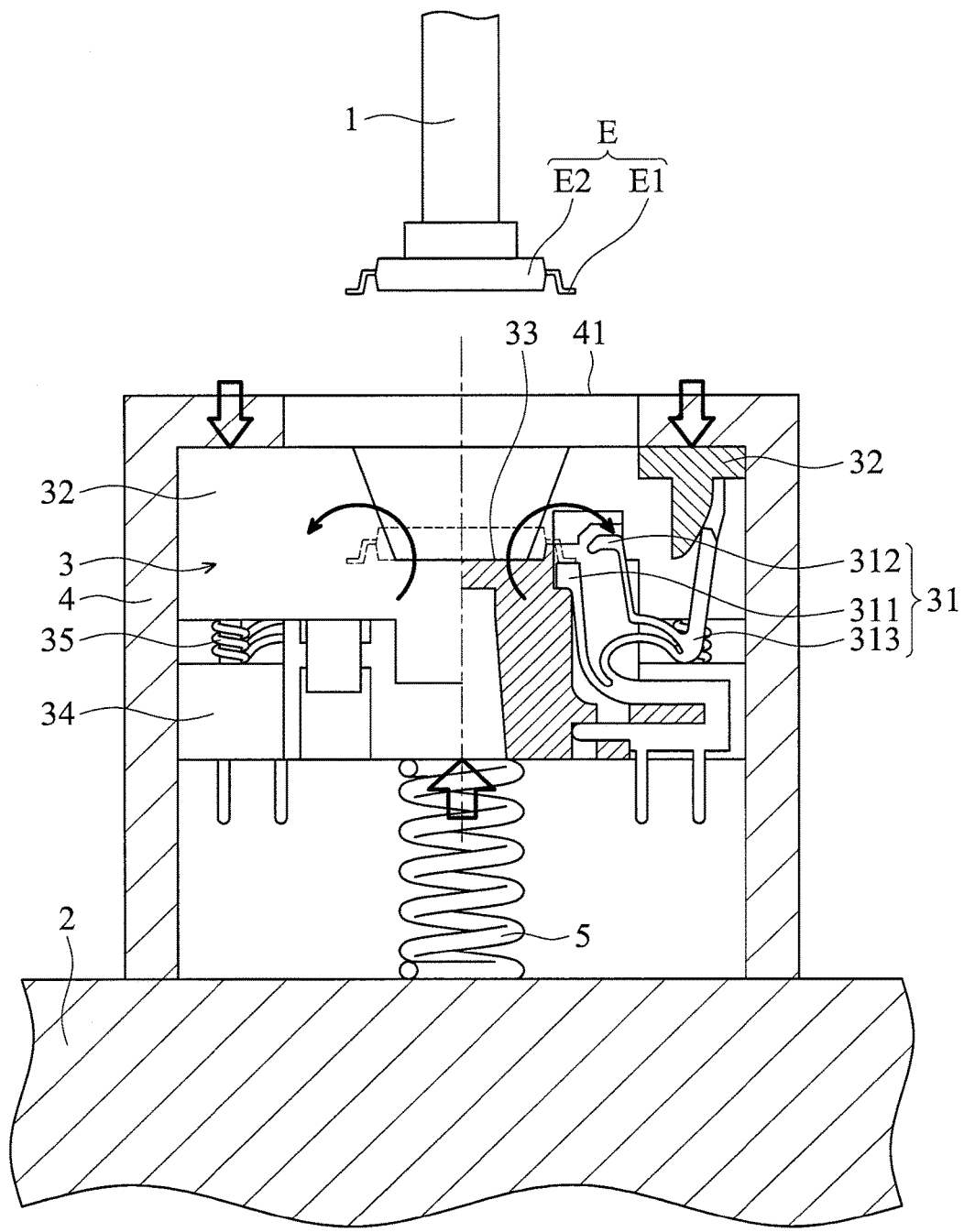

FIGS. 4A, 4B and 4C show the test process of the turret handler T of the embodiment of the invention. In this embodiment, the position of the abutting unit relative to the stage is fixed. The abutting unit 4 is a cover. The test block 3 is disposed in the abutting unit 4. The abutting unit 4 is affixed to the stage 2. An access opening 41 is formed on the top of the abutting unit 4. The nozzle 1 and the electronic elements E enter and leave the abutting unit 4 through the access opening 41.

With reference to FIGS. 4A, 4B and 4C, the test block is freely moved between a first position (as shown in FIGS. 4A and 4C) and a second position (as shown in FIG. 4B).

In one embodiment, the turret handler T further comprises an elastic unit 5. The elastic unit 5 is disposed between the stage 2 and the test block 3. The elastic unit 5 is adapted to push the elastic block 3 from the second position to the first position, and continuously pushes the elastic block 3 when the elastic block 3 is in the first position. When the test block 3 is in the first position, due to the elastic unit 5 pushing the elastic block 3, the abutting unit 4 applies a reaction force to the initiative portion 32. When the test block 3 is in the second position, the abutting unit 4 is separated from the test block 3.

With reference to FIGS. 4A and 4B, in one embodiment, the test block 3 compresses a placement portion 33. As mentioned above, the electronic element E comprises the element body E2 and the leads E1. The nozzle 1 indirectly pushes the placement portion 33 by directly pushing the element body E2. When the nozzle 1 and the element body E2 push the placement portion 33. The test block 3 is pushed from the first position (FIG. 4A) to the second position (FIG. 4B), the abutting unit 4 is separated from the test block 3, the reaction force applied upon the initiative portion 32 is released, the initiative portion 32 releases the elastic structure 313, and the pressing portion 312 is rotated to a second orientation to press the leads E1 and the coupling portion 311.

With reference to FIG. 4C, when the nozzle 1 and the electronic element E are raised to leave the test block 3, the test block 3 is moved from the second position (FIG. 4B) to the first position (FIG. 4C) by the elastic unit 5. The abutting unit 4 applies the reaction force to the initiative portion 32, the initiative portion 32 pushes the elastic structure 313, and the pressing portion 312 returns to the first orientation and is separated from the leads E1. The electronic E therefore can freely leave the test block 3.

With reference to FIG. 4A, in an access state, the reaction force is applied to the initiative portion 32, the initiative portion 32 pushes the elastic structure 313, and the pressing portion 312 is in the first orientation. The pressing portion 312 is separated from the coupling portion 311, and the nozzle 1 can pick or place the electronic element E between the pressing portion 312 and the coupling portion 311. With reference to FIG. 4B, in a test state, the reaction force upon the initiative portion 32 is released, the initiative portion 32 releases the elastic structure 313, the pressing portion 312 is moved to the second orientation to press the leads E1 and the coupling portion 311, and the leads E1 are positioned by the pressing portion 312 and are coupled to the coupling portion 311. With reference to FIG. 4A, in the access state, the abutting unit 4 applies the reaction force to the initiative portion 32. With reference to FIG. 4B, in the test state, the abutting unit 4 is separated from the test block, and the reaction force upon the initiative portion 32 is released.

In one embodiment, a normal gap dl is formed between an upper surface of the coupling portion 311 and an upper surface of the placement portion 33. The normal gap dl is equal to a standoff value of the leads E1 of the electronic element E. Utilizing the turret handler of the embodiment of the invention, when the nozzle 1 indirectly pushes the placement portion 33 by directly pushing the element body E2, the major portion of the stress applied by the nozzle 1 is directly transmitted to the placement portion 33 through the bottom of the element body E2 of the electronic element E rather than through the leads E1. Therefore, the lead E1 are prevented from becoming deformed by the stress applied by the nozzle 1, and the standoff value of the leads E1 is maintained, and the reliability of the electronic element is increased.

With reference to FIGS. 4A, 4B and 4C, in one embodiment, the test block 3 further comprises a base 34 and a recovery unit 35. The recovery unit 35 is disposed between the base and the initiative portion 32, and provides a recovery force to the initiative portion 32. The coupling portion 311 and the elastic structure 13 are connected to the base 34.

Figure 5:
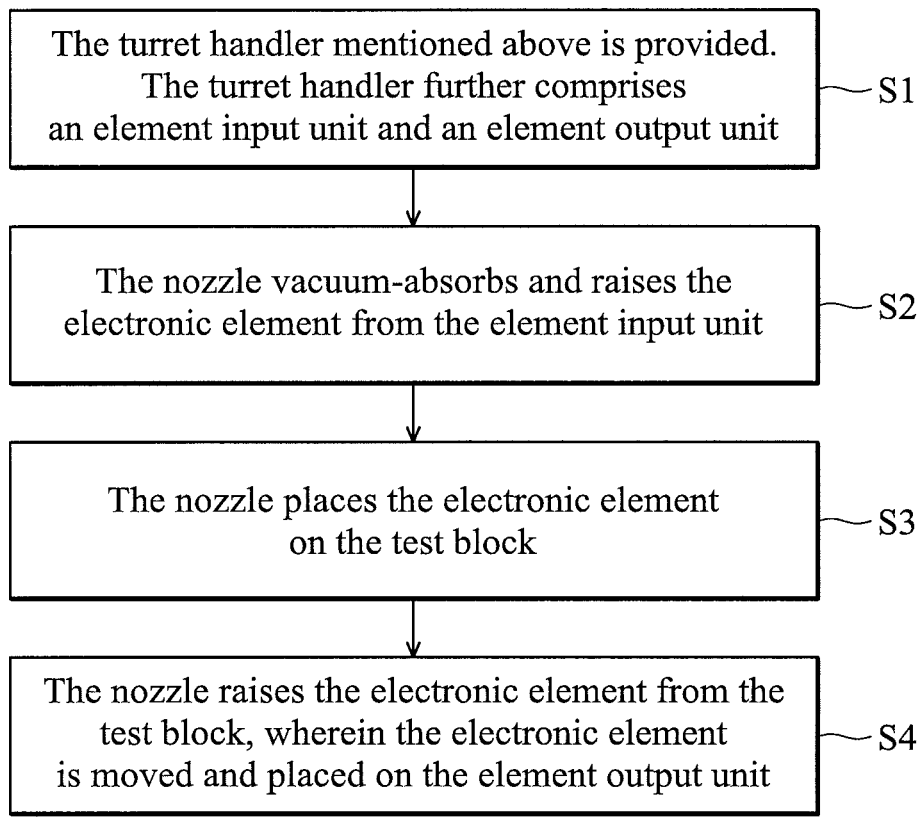
FIG. 5 shows a test method of an embodiment of the invention.

Reference to FIG. 5, in one embodiment, a test method is provided. First, the turret handler mentioned above is provided. The turret handler further comprises an element input unit (such as a tray) and an element output unit (S1). Then, the nozzle vacuum-absorbs and raises the electronic element from the element input unit (S2). Next, the nozzle places the electronic element on the test block (S3). Then, the nozzle raises the electronic element from the test block, wherein the electronic element is moved and placed on the element output unit (S4). In the access state and the test state, the nozzle continuously holds the electronic element. Particularly, between the step of the nozzle holding and raising the electronic element from the element input unit and the step of the nozzle placing the electronic element to the element output unit, the nozzle continuously vacuum-absorbs the electronic element. Utilizing the embodiment, in the test process, the nozzle continuously holds the electronic element, and the time for picking and placing the electronic element (creating vacuum and breaking vacuum) is reduced, and the test efficiency is therefore increased.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A turret handler, adapted to test an electronic element, wherein the electronic element comprises an element body and a plurality of leads, comprising:
   a nozzle, adapted to hold the element body to move the electronic element;
   a stage;
   a test block, disposed on the stage, wherein the nozzle moves the electronic element to the test block, comprising:

a coupling unit, comprising a coupling portion, a pressing portion and an elastic structure, wherein the elastic structure is connected to the pressing portion; and an initiative portion, connected to the elastic structure; and an abutting unit, wherein in an access state, the abutting unit applies a reaction force to the initiative portion, the initiative portion pushes the elastic structure, the pressing portion is in a first orientation, and the electronic element is picked or placed, and in a test state, the abutting unit is separated from the test block, the reaction force upon the initiative portion is released, the initiative portion releases the elastic structure, the pressing portion is moved to a second orientation to press the leads and the coupling portion, and the electronic element is tested through the coupling portion.

2. The turret handler as claimed in claim 1, wherein a position of the abutting unit relative to the stage is fixed, the test block is moved between a first position and a second position, and when the test block is in the first position, the abutting unit applies the reaction force to the initiative portion, and when the test block is in the second position, the abutting unit is separated from the test block.

3. The turret handler as claimed in claim 2, further comprising an elastic unit, the elastic unit is disposed between the stage and the test block, and the elastic unit is adapted to push the elastic block from the second position to the first position.

4. The turret handler as claimed in claim 3, wherein the abutting unit is a cover, the test block is disposed in the abutting unit, and the abutting unit is affixed to the stage.

5. The turret handler as claimed in claim 4, wherein the abutting unit comprises an access opening, and the nozzle and the electronic elements enter and leave the abutting unit through the access opening.

6. The turret handler as claimed in claim 3, wherein the test block compresses a placement portion, when the nozzle and the electronic element push the placement portion, the test block is pushed from the first position to the second position, the abutting unit is separated from the test block, the reaction force applied upon the initiative portion is released, the initiative portion releases the elastic structure, and the pressing portion is rotated to the second orientation to press the leads and the coupling portion.

7. The turret handler as claimed in claim 6, wherein when the nozzle and the electronic element are raised, the test block is moved from the second position to the first position by the elastic unit, the abutting unit applies the reaction force to the initiative portion, the initiative portion pushes the elastic structure, and the pressing portion returns to the first orientation and is separated from the leads.

8. The turret handler as claimed in claim 6, wherein a normal gap is formed between an upper surface of the coupling portion and an upper surface of the placement portion, and the normal gap is equal to a standoff value of the leads of the electronic element.

* * * * *